United States Patent
Atherton et al.

(10) Patent No.: US 12,106,016 B2
(45) Date of Patent: *Oct. 1, 2024

(54) ROBOTIC ASSEMBLY OF A MESH SURFACE

(71) Applicant: AUTODESK, INC., San Francisco, CA (US)

(72) Inventors: Evan Patrick Atherton, San Carlos, CA (US); David Thomasson, Fairfax, CA (US); Maurice Ugo Conti, Muir Beach, CA (US); Heather Kerrick, Oakland, CA (US); Nicholas Cote, San Francisco, CA (US)

(73) Assignee: AUTODESK, INC., San Francisco, CA (US)

( * ) Notice: Subject to any disclaimer, the term of this patent is extended or adjusted under 35 U.S.C. 154(b) by 232 days.

This patent is subject to a terminal disclaimer.

(21) Appl. No.: 17/103,606

(22) Filed: Nov. 24, 2020

(65) Prior Publication Data

US 2021/0073445 A1 Mar. 11, 2021

Related U.S. Application Data

(63) Continuation of application No. 15/607,289, filed on May 26, 2017, now Pat. No. 10,853,539.

(51) Int. Cl.
*G06F 30/23* (2020.01)
*B23K 9/10* (2006.01)
(Continued)

(52) U.S. Cl.
CPC ............ *G06F 30/17* (2020.01); *B25J 9/1682* (2013.01); *B25J 9/1687* (2013.01); *G06F 30/23* (2020.01);
(Continued)

(58) Field of Classification Search
CPC ........ G06F 30/23; G06F 30/20; B25J 9/1687; B25J 9/1682; B23K 9/1037;
(Continued)

(56) References Cited

U.S. PATENT DOCUMENTS 10,150,213 B1 12/2018 Linnell et al.
2010/0204824 A1* 8/2010 Luce ...................... E21B 10/43
901/14
(Continued)

OTHER PUBLICATIONS

Yap HJ, Taha Z, Dawal SZ, Chang SW. Virtual reality based support system for layout planning and programming of an industrial robotic work cell. PLoS One. Oct. 31, 2014;9(10):e109692. doi: 10.1371/journal.pone.0109692. PMID: 25360663; PMCID: PMC4215904. (Year: 2014).*

(Continued)

*Primary Examiner* — Eunhee Kim
(74) *Attorney, Agent, or Firm* — Artegis Law Group, LLP

(57) ABSTRACT

A robotic assembly cell is configured to generate a physical mesh of physical polygons based on a simulated mesh of simulated triangles. A control application configured to operate the assembly cell selects a simulated polygon in the simulated mesh and then causes a positioning robot in the cell to obtain a physical polygon that is similar to the simulated polygon. The positioning robot positions the polygon on the physical mesh, and a welding robot in the cell then welds the polygon to the mesh. The control application captures data that reflects how the physical polygon is actually positioned on the physical mesh, and then updates the simulated mesh to be geometrically consistent with the physical mesh. In doing so, the control application may execute a multi-objective solver to generate an updated simulated mesh that meets specific design criteria.

24 Claims, 6 Drawing Sheets

(51) Int. Cl.
  *B25J 9/16* (2006.01)
  *G05B 19/4068* (2006.01)
  *G06F 30/17* (2020.01)
  *G06F 30/20* (2020.01)

(52) U.S. Cl.
  CPC ........ *B23K 9/1037* (2013.01); *G05B 19/4068* (2013.01); *G05B 2219/35117* (2013.01); *G05B 2219/37205* (2013.01); *G05B 2219/39132* (2013.01); *G06F 30/20* (2020.01)

(58) Field of Classification Search
  CPC ...... G05B 19/4068; G05B 2219/39132; G05B 2219/35117; G05B 2219/37205
  See application file for complete search history.

(56) References Cited

U.S. PATENT DOCUMENTS

| | | |
|---|---|---|
| 2012/0197438 A1 | 8/2012 | Ogami |
| 2013/0147944 A1 | 6/2013 | Zhang et al. |
| 2014/0018957 A1 | 1/2014 | Matsumoto |
| 2014/0309762 A1 | 10/2014 | Hayata et al. |
| 2015/0190926 A1 | 7/2015 | Miegel et al. |
| 2015/0251314 A1 | 9/2015 | Nammoto et al. |
| 2017/0061037 A1 | 3/2017 | Makem et al. |
| 2018/0111266 A1 | 4/2018 | Okada et al. |
| 2018/0250820 A1* | 9/2018 | Shimodaira ............ B25J 9/1697 |

OTHER PUBLICATIONS

Kriegel, S., Rink, C., Bodenmüller, T. et al. Efficient next-best-scan planning for autonomous 3D surface reconstruction of unknown objects. J Real-Time Image Proc 10, 611-631 (2015). https://doi.org/10.1007/s11554-013-0386-6 (Year: 2015).*

Bi, Z. M., and Lihui Wang. "Advances in 3D data acquisition and processing for industrial applications." Robotics and Computer-Integrated Manufacturing 26, No. 5 (2010): 403-413. (Year: 2010).*

Sherwin et al., "Mesh generation in curvilinear domains using high-order elements", International Journal for Numerical Methods in Engineering, DOI: 10.1002/nme.397, vol. 53, 2002, pp. 207-223.

* cited by examiner

MESH REGION
600

SIMULATED MESH
500

SIMULATED MESH 800

SIMULATED MESH 700

ROBOTIC ASSEMBLY OF A MESH SURFACE

CROSS-REFERENCE TO RELATED APPLICATIONS

The present application is a continuation of U.S. patent application titled, "ROBOTIC ASSEMBLY OF A MESH SURFACE" filed on May 26, 2017 and having Ser. No. 15/607,289 (issued on Dec. 1, 2020 as U.S. Pat. No. 10,853, 539). The subject matter of the related application is hereby incorporated herein by reference.

BACKGROUND OF THE INVENTION

Field of the Invention

Embodiments of the present invention relate generally to robotics and, more specifically, to robotic assembly of a mesh surface.

Description of the Related Art

With a conventional computer-aided design (CAD) program, an engineer may generate a 3D model that includes a mesh of interconnected polygons. The engineer may then fabricate a physical object based on the 3D model using a conventional 3D printer. However, one drawback associated with this approach is that conventional 3D printers fabricate physical objects based only on a sliced representation of the 3D model, and not based on the 3D model itself. Consequently, physical objects generated via 3D printing of 3D models are generally inconsistent with the 3D model itself. In addition, conventional 3D printers fabricate objects with low-grade materials, such as plastics. Therefore, conventional 3D printers cannot be used for architectural-scale projects that require high performance materials, such as steel or carbon fiber, among others.

As the foregoing illustrates, what is needed in the art is a more effective way to fabricate objects.

SUMMARY OF THE INVENTION

Various embodiments of the present invention set forth a computer-implemented method for operating an assembly cell of robots to assemble a mesh, including selecting a first simulated polygon that is included in a first simulated mesh, causing a first robot to obtain a first physical polygon that corresponds to the first simulated polygon, causing the first robot to position the first physical polygon on a first physical mesh, and causing a second robot to attach the first physical polygon to the first physical mesh, where at least a portion of the first physical mesh is geometrically similar to the first simulated mesh.

At least one advantage of the techniques described herein is that the robotic assembly cell can tolerate a variety of fabrication inaccuracies that may arise during the fabrication process and still generate a physical mesh that is geometrically consistent with the corresponding simulated mesh.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In the following description, numerous specific details are set forth to provide a more thorough understanding of the present invention. However, it will be apparent to one of skill in the art that the present invention may be practiced without one or more of these specific details.

System Overview

Figure 1:
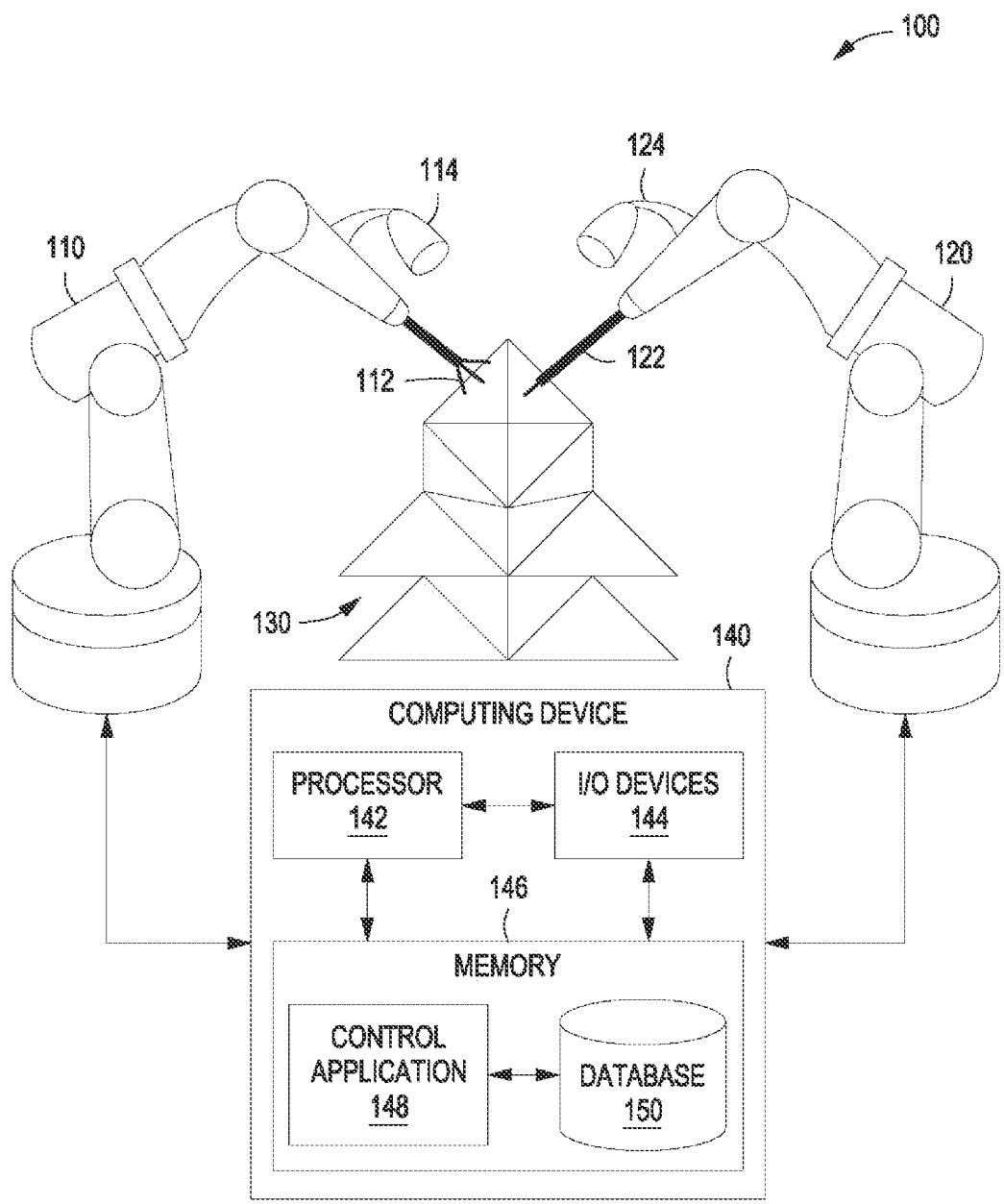
FIG. 1 illustrates a system configured to implement one or more aspects of the present invention.

FIG. 1 illustrates a system configured to implement one or more aspects of the present invention. As shown, a robot system 100 includes a positioning robot 110 and a welding robot 120 configured to cooperatively fabricate a physical mesh 130. Physical mesh may be any technically feasible three-dimensional (3D) structure that includes an assembly of polygons.

Positioning robot 110 includes a positioning tool 112 and an optical device 114. Positioning tool 112 may be any technically feasible type of manipulator capable of holding, moving, and positioning physical objects. In one embodiment, positioning tool 112 includes a suction device. Via positioning tool 112, positioning robot 110 is configured to position physical polygons on physical mesh 130 for welding via welding robot 120. Optical device 114 is a sensor configured to capture frames of video data related to the fabrication of physical mesh 130, including the positioning operation discussed above and a welding operation described in greater detail below. In practice, optical device 114 is a video camera, although other types of sensors fall within the scope of the present invention, including audio sensors, among others. In one embodiment, optical device 114 is a laser scanner configured to generate a point cloud representation of physical mesh 130.

Welding robot 120 includes a welding tool 122 and an optical device 124. Welding tool 122 may be any technically feasible device capable of attaching one physical object to another physical object. In one embodiment, welding tool 122 is a metal inert gas (MIG) welder configured to output a superheated welding wire. Via welding tool 122, welding robot 120 is configured to weld physical polygons positioned by positioning robot 110 onto physical mesh 130. Like optical device 114, optical device 124 is a sensor configured to capture frames of video data related to the fabrication of physical mesh 130, including the positioning operation described above and the welding operation described herein.

Each of positioning robot 110 and welding robot 120 may be a 6-axis robotic arm, as is shown. Both positioning robot 110 and welding robot 120 are coupled to computing device 140. Computing device 140 is configured to coordinate the operation of both robots in fabricating physical mesh 130. In doing so, computing device 140 receives various data signals from positioning robot 110 and welding robot 120, including feedback signals, sensor signals, video frames, and so forth, and then processes those signals to generate commands for controlling those robots. Computing device 140 includes a processor 142, input/output (I/O) devices 144, and a memory 146, as shown.

Processor 142 may be any technically feasible form of processing device configured to process data and execute program code. Processor 142 could be, for example, a central processing unit (CPU), a graphics processing unit (GPU), an application-specific integrated circuit (ASIC), a field-programmable gate array (FPGA), any technically feasible combination of such units, and so forth.

I/O devices 144 may include devices configured to receive input, including, for example, a keyboard, a mouse, and so forth. I/O utilities 144 may also include devices configured to provide output, including, for example, a display device, a speaker, and so forth. I/O utilities 144 may further include devices configured to both receive and provide input and output, respectively, including, for example, a touchscreen, a universal serial bus (USB) port, and so forth.

Memory 146 may include any technically feasible storage medium configured to store data and software applications. Memory 146 could be, for example, a hard disk, a random access memory (RAM) module, a read-only memory (ROM), and so forth. Memory 146 includes a control application 148 and a database 150. Control application 148 is a software application that, when executed by processor 142, implements a closed-loop control process that is described in greater detail below in conjunction with FIG. 2.

Figure 2:
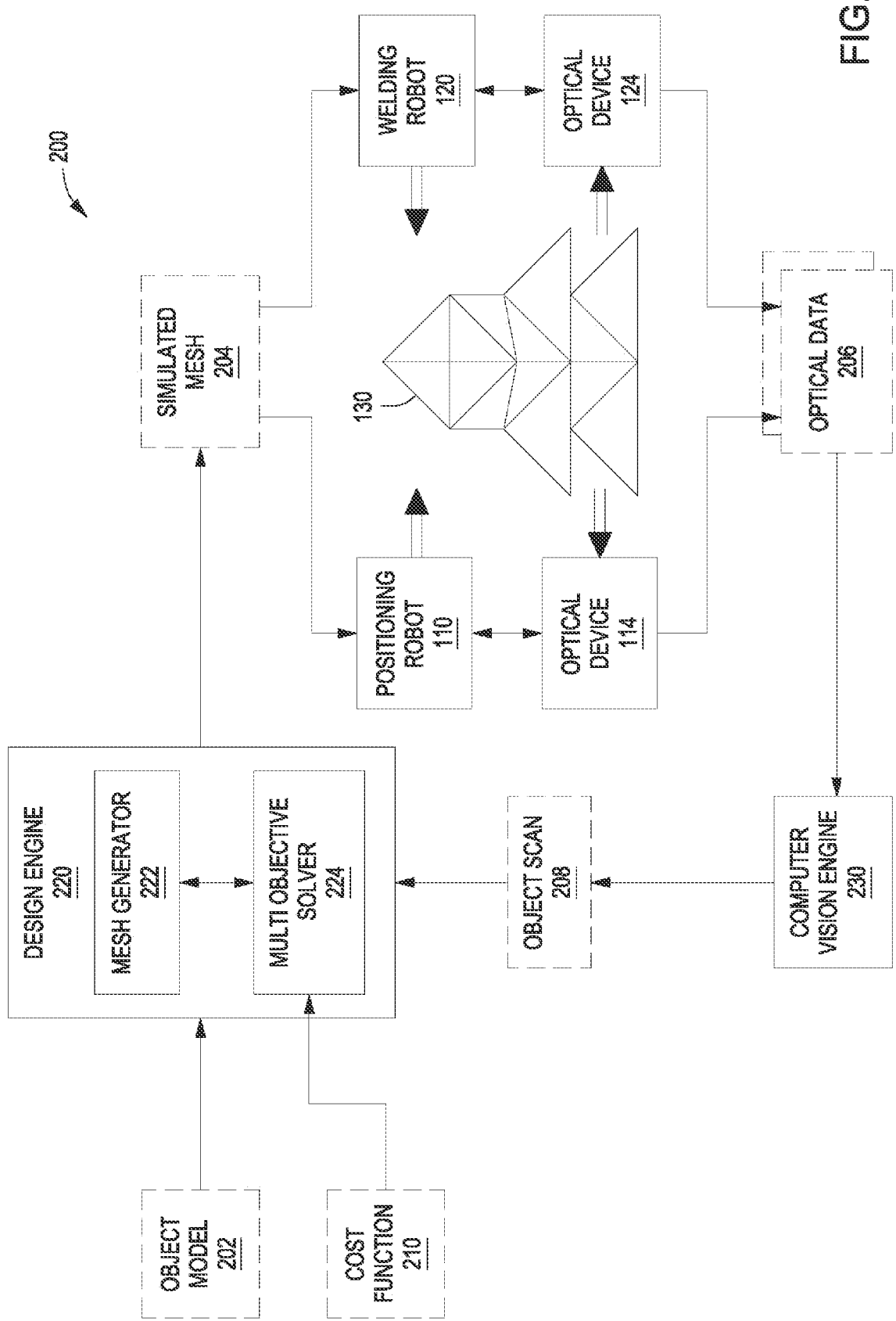
FIG. 2 illustrates a closed-loop control process coordinated by the control application of FIG. 1, according to various embodiments of the present invention.

FIG. 2 illustrates a closed-loop control process coordinated by the control application of FIG. 1, according to various embodiments of the present invention. As shown, closed-loop control process 200 includes a design engine 200, positioning robot 110, optical device 112, welding robot 120, optical device 122, and computer vision engine 230. Design engine 220 and computer vision engine 230 are software modules implemented within control application 148. Design engine 220 includes a mesh generator 222 and a multi-objective solver 224.

In operation, design engine 220 receives an object model 202 that represents physical mesh 130. Object model 202 may be a computer-aided design (CAD) model of physical mesh 130, a parameterized model of physical mesh 130, or a set of material deposition paths for fabricating physical mesh 130, among other possibilities. Mesh generator 222 within design engine 220 is configured to process object model 202 to generate a simulated mesh 204. Simulated mesh 204 is a mesh of polygons that represents object model 202 and physical mesh 130. Design engine 220 is configured to transmit simulated mesh 204 and/or commands associated with simulated mesh 204 to positioning robot 110 and welding robot 120.

Based on simulated mesh 204 and/or the associated commands, positioning robot 110 and welding robot 120 assemble physical mesh 130 polygon by polygon. In doing so, positioning robot 110 obtains a physical polygon that corresponds to a simulated polygon in simulated mesh 204. Positioning robot 110 may fabricate the physical polygon or select a physical polygon that is substantially similar to the simulated polygon. Positioning robot 110 then positions the physical polygon relative to physical mesh 130 based on the corresponding positioning of the simulated polygon in simulated mesh 204. Welding robot 120 then welds the physical polygon to physical mesh 130. Design engine 220 generally coordinates this process and, in doing so, may select the particular polygon to be positioned and welded from within simulated mesh 204.

Optical devices 114 and 124 are configured to capture video data of the above assembly and fabrication process and to transmit the captured data to computer vision engine 230 as optical data 206. Optical data 206 may include raw frames of video data and potentially other types of sensor data. Computer vision engine 230 processes optical data 206 to establish how closely the positioning of the physical polygon, upon being welded, matches the positioning of the corresponding simulated polygon in simulated mesh 204. Computer vision engine 230 transmits this data to design engine 220 as object scan 208. Object scan 208 may include a variety of data, including physical vertex locations of the physical polygon, among others.

Based on object scan 208, design engine 220 causes mesh generator 222 to update simulated mesh 204 to reflect physical mesh 130. In particular, mesh generator 222 may update the positioning of the simulated polygon to match the positioning of the recently welded physical polygon. In some cases, the recently welded physical polygon may be positioned accurately and, therefore, simulated mesh 204 may be geometrically consistent with physical mesh 130 and not need updating. However, in other cases the physical polygon may be positioned and welded inaccurately, and so simulated mesh 204 may be geometrically different from physical mesh 130 and need to be updated. In such cases, design engine 220 updates simulated mesh 204 so that the simulated polygon matches the actual positioning of the physical polygon. However, because that simulated polygon is part of a mesh of other polygons, design engine 220 may also need to update other neighboring simulated polygons within simulated mesh 204.

Accordingly, design engine 220 may execute multi-objective solver 224, in conjunction with mesh generator 222, to update simulated mesh 204 in a manner that compensates for the inaccurate placement of the physical polygon. In doing so, multi-objective solver 224 minimizes a cost function 210. Cost function 210 may represent any particular characteristic of simulated mesh 204, including, for example, a total change in curvature of simulated mesh 204, a number of polygons of simulated mesh 204 to be modified, among others. In one embodiment, multi-objective solver 224 and cost function 210 correspond to a genetic algorithm configured to generate a spectrum of updated simulated meshes and then narrow that spectrum to a single updated simulated mesh that minimizes cost function 210.

Once design engine 220 has updated simulated mesh 204, the process described above repeats until robot system 100 has fabricated all of physical mesh 130. Because design engine 220 is capable of compensating for fabrication inaccuracies, robot system 100 can fabricate physical mesh 130 to be substantially similar to object model 202 despite such inaccuracies. The above techniques are also described in stepwise fashion below in conjunction with FIG. 3 and also by way of example below in on conjunction with FIGS. 4A-8.

Figure 3:
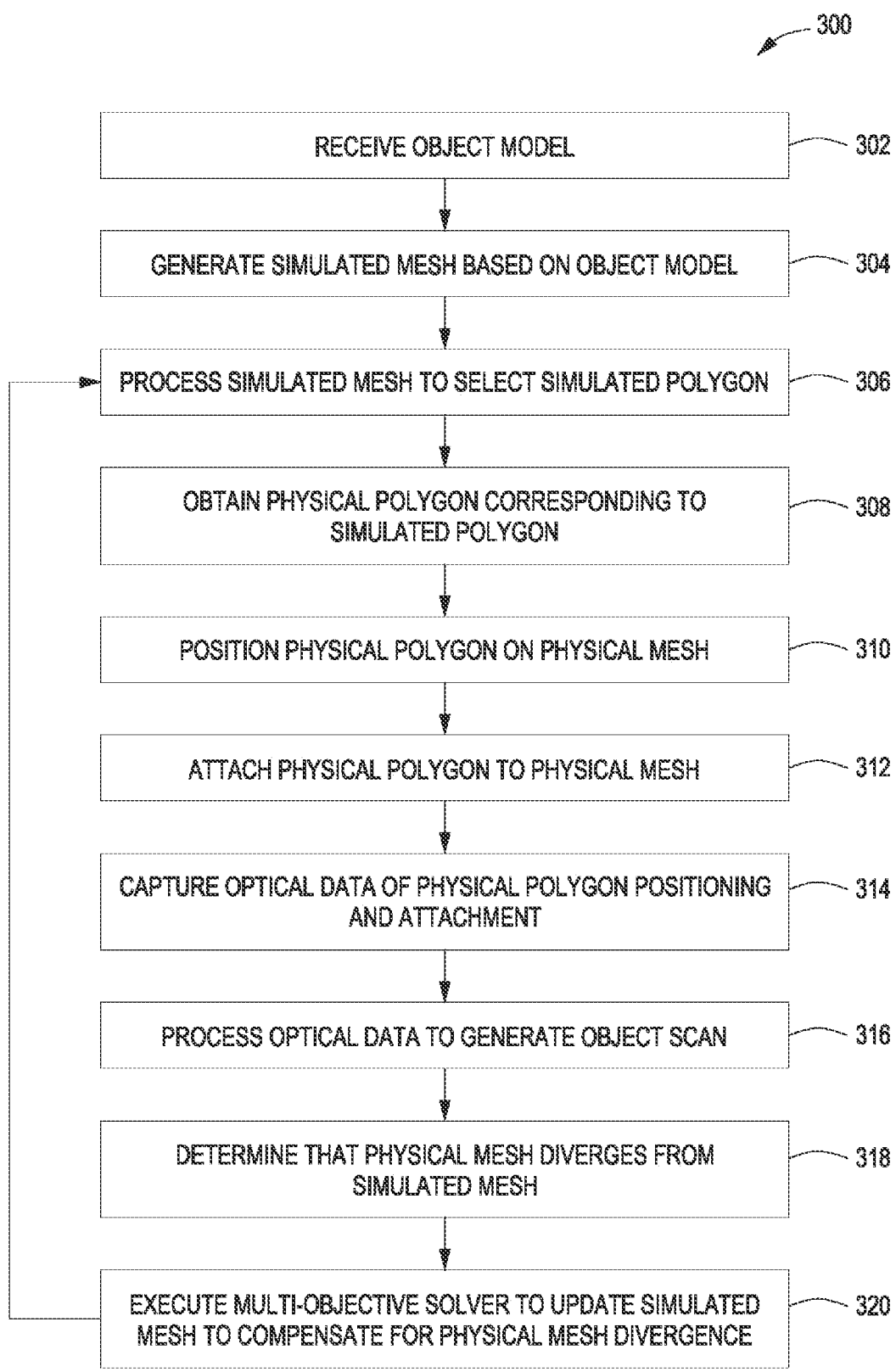
FIG. 3 is a flow diagram of method steps for assembling a mesh via an assembly cell, according to various embodiments of the present invention.

FIG. 3 is a flow diagram of method steps for assembling a mesh via an assembly cell, according to various embodiments of the present invention. Although the method steps are described in conjunction with the systems of FIGS. 1-2, persons skilled in the art will understand that any system configured to perform the method steps, in any order, is within the scope of the present invention.

As shown, a method 300 begins at step 302, where design engine 220 within control application 148 of robot system 100 receives object model 202. Object model 202 represents a 3D structure to be fabricated, such as physical mesh 130. At step 304, mesh generator 222 generate simulated mesh 204 based on object model 202. At step 306, design engine 220 processes simulated mesh 204 to select a simulated polygon for fabrication. In doing so, design engine 220 may identify particular polygons that should be fabricated before others due to structural dependencies between those polygons. At step 308, control application 148 causes positioning robot 110 to obtain a physical polygon corresponding to simulated polygon. Positioning robot 110 could fabricate the physical polygon or select a polygon from a set of available polygons. At step 310, control application 148 causes positioning robot 110 to position the physical polygon on physical mesh 130. At step 312, control application 148 causes welding robot 120 to weld the physical polygon to physical mesh 130.

At step 314, optical devices 114 and 124 capture optical data of the positioning and attachment of physical polygon performed via steps 310 and 312. At step 316, computer vision engine 230 processes optical data 206 gathered at step 314 to generate object scan 208. Object scan 208 may be a 3D model of physical mesh 130 or a portion thereof. At step 318, based on object scan 208, design engine 220 then determines that physical mesh 130 diverges geometrically from simulated mesh 204. For example, positioning robot 110 could place the physical polygon incorrectly, causing an offset in the angle of the physical polygon compared to the simulated counterpart.

To address this divergence, at step 320 design engine 220 updates simulated mesh 204 to accommodate the detected divergence in the following manner. First, design engine 220 causes mesh generator 222 to update the simulated polygon corresponding to the physical polygon to reflect the divergent positioning of that polygon within physical mesh 130. In addition, because the simulated polygon is part of a mesh of other simulated polygons, design engine 220 also updates those adjacent polygons. To do so, multi-objective solver 224 generates a spectrum of updated versions of simulated mesh having polygons adjusted to minimize a given cost function, such as cost function 210.

For example, multi-objective solver 224 could generate a spectrum of simulated meshes that minimize the number of polygons adjusted to maintain a watertight polygonal surface. In another example, multi-objective solver 224 could generate a spectrum of simulated meshes that minimizes the total change in normal vectors across all polygons adjusted to maintain a watertight surface. These particular examples are described in greater detail below in conjunction with FIGS. 4A-8.

Once design engine 220 updates simulated mesh 204 to compensate for the physical divergence between simulated mesh 204 and physical mesh 130, the method 300 then returns to step 306 and proceeds as described above. Design engine 220 may implement the method 300 repeatedly and, in some embodiments, once for each polygon of simulated mesh 204 to be fabricated. As mentioned, FIGS. 4A-8 illustrate a specific example of the techniques described thus far.

Exemplary Modification of a Simulated Mesh

Figure 4B:
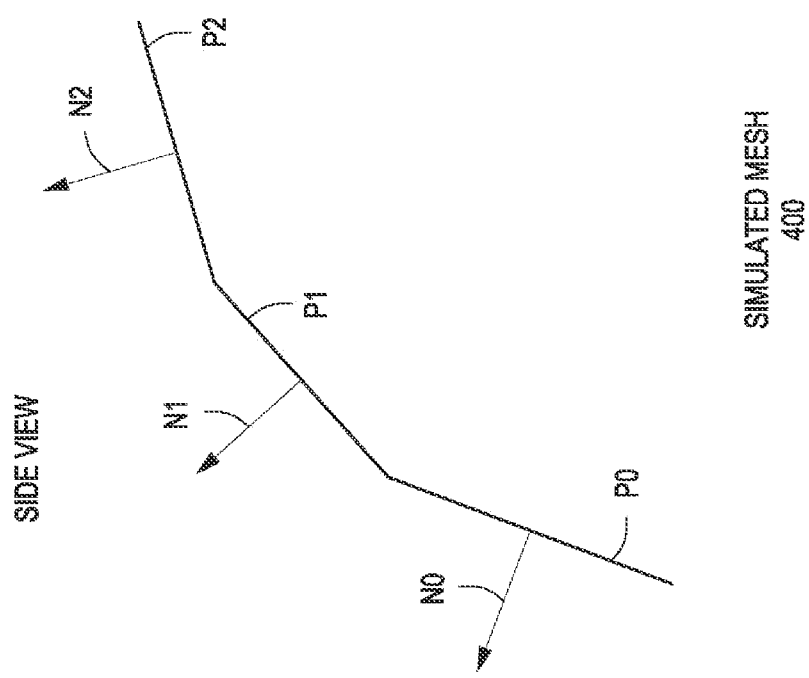
FIGS. 4A-4B illustrate an exemplary simulated mesh generated by the control application of FIG. 1, according to various embodiments of the present invention.
Figure 4A:
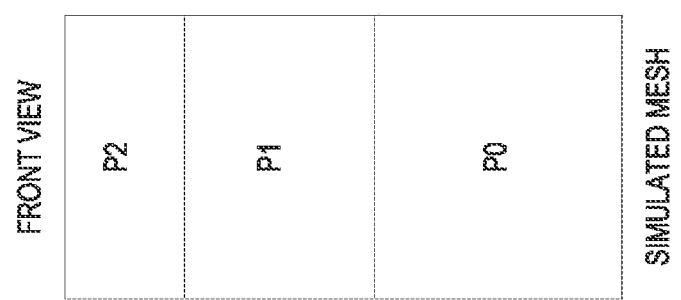

FIGS. 4A-4B illustrate an exemplary simulated mesh generated by the control application of FIG. 1, according to various embodiments of the present invention. As shown in FIG. 4A, a simulated mesh 400 includes three quadrilateral polygons P0, P1, and P2 coupled together. P0 and P1 are adjacent to one another and share one edge, and P1 and P2 are adjacent to one another and share one edge. As shown in FIG. 4A, P0, P1, and P2 form a convex surface with a curvature defined by surface normals N0, N1, and N2 corresponding to polygons P0, P1, and P2. In the example described herein, simulated mesh 400 corresponds to a physical mesh to be fabricated by robot system 100.

Figure 5:
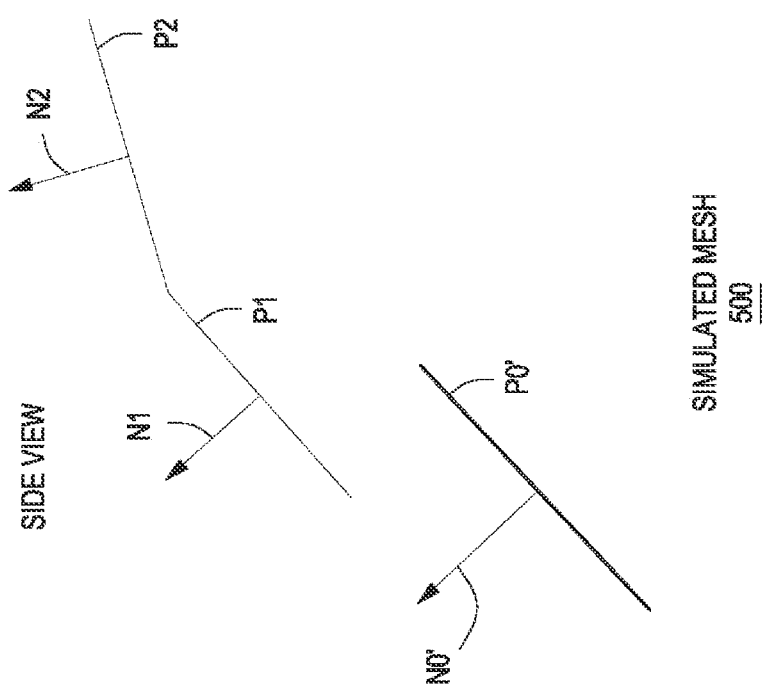
FIG. 5 illustrates the simulated mesh of FIGS. 4A-4B updated based on a scan of a physical mesh, according to various embodiments of the present invention.

FIG. 5 illustrates the simulated mesh of FIGS. 4A-4B updated based on a scan of a physical mesh, according to various embodiments of the present invention. As shown, a simulated mesh 500 includes P1 and P2, similar to simulated mesh 400. However, simulated mesh 500 also includes P0' having surface normal N0'. Design engine 220 generates simulated mesh 500 after robot system 100 attaches a physical polygon to physical mesh 130 based on P0, and then generates an object scan that reflects the placement of that physical polygon. P0' represents the actual placement of the physical polygon, which may be different compared to the placement of P0, as shown in FIG. 6.

Figure 6:
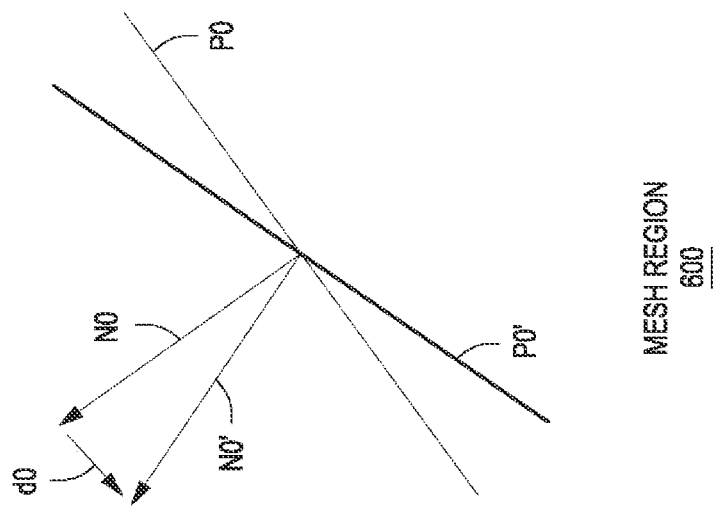
FIG. 6 illustrates a comparison between a target placement for a physical polygon and a scanned placement of the physical polygon, according to various embodiments of the present invention.
Figure 8:
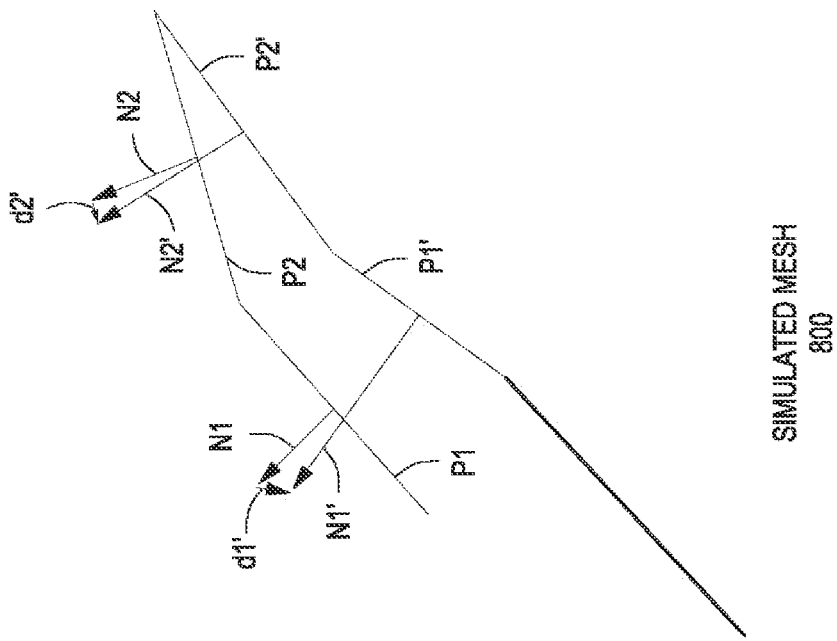
FIG. 8 illustrates the simulated mesh of FIGS. 4A-4B updated based on the scanned placement of the physical polygon, according to other various embodiments of the present invention.
Figure 7:
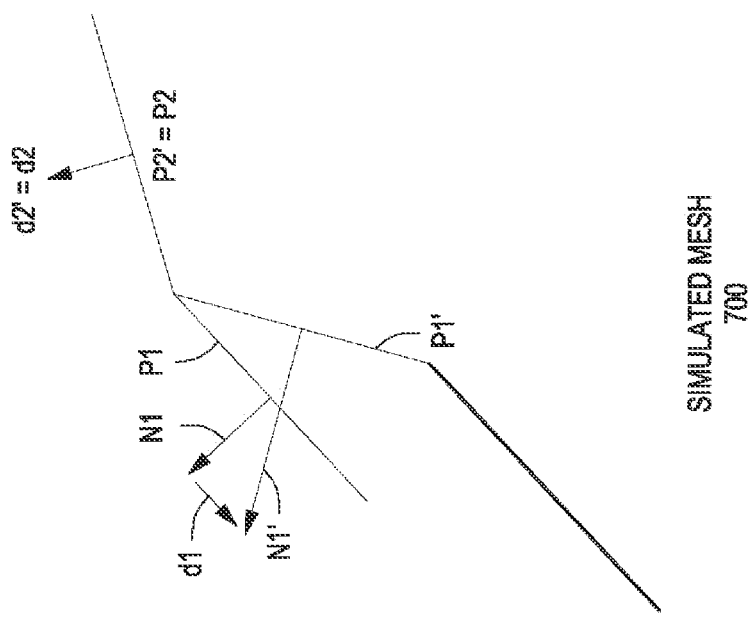
FIG. 7 illustrates the simulated mesh of FIGS. 4A-4B updated based on the scanned placement of the physical polygon, according to various embodiments of the present invention.

FIG. 6 illustrates a comparison between a target placement for a physical polygon and a scanned placement of the physical polygon, according to various embodiments of the present invention. As shown, P0' resides at a different angle compared to P0 and therefore N0' is offset compared to N0 by a distance d0. One consequence of the inaccurate placement of P0' is that P0' is disjoint from P1, and simulated mesh 500 is no longer watertight. Accordingly, robot system 100 may not be able to continue fabricating the physical mesh based on simulated mesh 500 without adjusting that simulated mesh. FIGS. 7-8 illustrate two techniques for adjusting a simulated mesh.

FIG. 7 illustrates the simulated mesh of FIGS. 4A-4B updated based on the scanned placement of the physical polygon, according to various embodiments of the present invention. As shown, simulated mesh 700 includes P1' having surface normal N1'. P1' is an adjusted version of P1 and is coupled to P0'. Accordingly, simulated mesh 700 is watertight and able to be fabricated. Design engine 220 generates P1', including specific vertex locations, by executing multi-objective solver 224 with cost function 210. In the exemplary approach shown in FIG. 7, cost function 210 indicates that the number of polygons modified to compensate for the incorrect placement of P0' should be minimized.

In one embodiment, multi-objective solver 224 implements a genetic algorithm configured to generate multiple evolutions of simulated meshes. The genetic algorithm may adjust polygons within a particular region or only adjust polygons directly adjacent to P0'. Across each evolution, the genetic algorithm creates a spectrum of candidate simulated meshes and then eliminates a portion of those candidates based on cost function 210. In this manner, the genetic algorithm may converge to simulated mesh 700.

FIG. 8 illustrates the simulated mesh of FIGS. 4A-4B updated based on the scanned placement of the physical polygon, according to other various embodiments of the present invention. As shown, simulated mesh 800 includes P1' having surface normal N1' and P2' having surface normal N2'. Surface normals N1 and N1' are offset by d1', while surface normals N2 and N2' are offset by d2'. Because P0' is coupled to P1' and P1' is coupled to P2', simulated mesh 800 is watertight and able to be fabricated. Design engine 220 generates P1' and P2', including specific vertex locations, by executing multi-objective solver 224 with cost function 210. In the exemplary approach shown in FIG. 8, cost function 210 indicates that the total change in normal vectors across all modified polygons should be minimized. In other words, cost function 210 indicates that the curvature of the simulated mesh should be changed as little as possible.

In one embodiment, multi-objective solver 224 implements a genetic algorithm configured to generate multiple evolutions of simulated meshes. The genetic algorithm may adjust polygons within a particular region or neighborhood and then eliminate candidate simulated meshes which excessively change the curvature of the simulated mesh. In this manner, the genetic algorithm may converge to simulated mesh 800, which has a curvature somewhat similar to that associated with the original simulated mesh 400.

Referring generally to FIGS. 7-8, the cost function discussed in conjunction with these Figures may be combined to yield a cost function that minimizes both total change in curvature and number of polygons modified, as discussed below in conjunction with Equation 1 and Equation 2:

$$\|\delta_i\| = \|N'_i - N_i\| \quad \text{Equation 1}$$

Equation 1 defines the magnitude of the distance between two normal vectors, referred to herein as delta normal. For example, Equation 1 may define delta normal d0 of FIG. 5 based on N0 and N0'. Generally, Equation 1 represents a change in curvature of a simulated mesh that results from adjusting a polygon in that mesh. Equation 2 is a cost function that is based on Equation 1:

$$C_e = \left(\sum_{i=2}^{n} \sigma_i \|\delta_i\|\right) + \mu T \quad \text{Equation 2}$$

Equation 2 represents the sum of all delta normals across all polygons in the mesh, weighted by a penalty term σ. In addition, Equation 2 also includes a term μT, where μ is a penalty term and T is the number of polygons modified. Multi-objective solver 224 may implement Equation 2 as cost function 210 in order to evaluate candidate simulated meshes. By evaluating multiple simulated meshes across many generations of candidate simulated meshes and across many iterations of closed-loop control process 200, multi-objective solver 224 continuously updates the simulated mesh to compensate for errors that may occur during the fabrication process.

In sum, a robotic assembly cell is configured to generate a physical mesh of physical polygons based on a simulated mesh of simulated triangles. A control application configured to operate the assembly cell selects a simulated polygon in the simulated mesh and then causes a positioning robot in the cell to obtain a physical polygon that is similar to the simulated polygon. The positioning robot positions the polygon on the physical mesh, and a welding robot in the cell then welds the polygon to the mesh. The control application captures data that reflects how the physical polygon is actually positioned on the physical mesh, and then updates the simulated mesh to be geometrically consistent with the physical mesh. In doing so, the control application may execute a multi-objective solver to generate an updated simulated mesh that meets specific design criteria.

At least one advantage of the techniques described above is that the robotic assembly cell can tolerate a variety of fabrication inaccuracies that may arise during the fabrication process and still generate a physical mesh that is geometrically consistent with the corresponding simulated mesh.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable processors or gate arrays.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

The invention claimed is:

1. A computer-implemented method for operating an assembly cell of robots to assemble a mesh, the method comprising:
   selecting a first simulated polygon that is included in a first simulated mesh;
   causing a first robot to obtain a first physical polygon that corresponds to the first simulated polygon;
   causing the first robot to position the first physical polygon on a first physical mesh;
   causing a second robot to attach the first physical polygon to the first physical mesh;
   updating the first simulated mesh based on a scanned 3D model of the first physical mesh generated from optical data associated with positioning and attaching the physical polygon to the first physical mesh to generate an updated simulated mesh that geometrically correspond to at least a portion of the first physical mesh;
   selecting a second simulated polygon that is included in the updated simulated mesh;
   causing the first robot to obtain a second physical polygon that corresponds to the second simulated polygon;
   causing the first robot to position the second physical polygon on the first physical mesh; and
   causing the second robot to attach the second physical polygon to the first physical mesh.

2. The computer-implemented method of claim 1, further comprising:
   obtaining optical data related to the first physical polygon; and
   determining, based on the optical data, that a first portion of the first physical mesh is geometrically different than a first portion of the first simulated mesh.

3. The computer-implemented method of claim 2, wherein determining that the first physical mesh is geometrically different than the first portion of the first simulated mesh comprises determining that a position associated with a vertex of the first simulated polygon is different than a position associated with a corresponding vertex of the first physical polygon.

4. The computer-implemented method of claim 1, further comprising updating a position associated with a vertex of the first simulated polygon within the first simulated mesh based on a position associated with a corresponding vertex of the first physical polygon within the first physical mesh.

5. The computer-implemented method of claim 4, further comprising updating a position associated with a third simulated polygon within the first simulated mesh to cause the first simulated mesh to be watertight.

6. The computer-implemented method of claim 1, further comprising:
   generating a plurality of simulated meshes based on a position of a vertex of the first physical polygon;
   evaluating a cost function with respect to each simulated mesh included in the plurality of simulated meshes to generate a cost value for each simulated mesh;
   identifying a second simulated mesh included in the plurality of simulated meshes having a lower cost value than every other simulated mesh included in the plurality of simulated meshes; and
   replacing the first simulated mesh with the second simulated mesh.

7. The computer-implemented method of claim 6, further comprising:
   selecting a third simulated polygon that is included in the second simulated mesh;
   causing the first robot to obtain a third physical polygon that corresponds to the third simulated polygon;
   causing the first robot to position the third physical polygon on the first physical mesh; and
   causing the second robot to attach the third physical polygon to the first physical mesh.

8. The computer-implemented method of claim 6, wherein the cost function includes a first term that penalizes any change in curvature identified in any of the simulated meshes included in the plurality of simulated meshes.

9. The computer-implemented method of claim 6, wherein the cost function includes a first term that penalizes a number of simulated polygons included in any of the simulated meshes included in the plurality of simulated meshes that are different than a number of simulated polygons included in the first simulated mesh.

10. The computer-implemented method of claim 1, wherein causing the first robot to obtain the first physical polygon comprises causing the first robot to fabricate the first physical polygon based on the first simulated polygon.

11. The computer-implemented method of claim 1, further comprising updating the first simulated mesh to geometrically correspond to at least a portion of the first physical mesh subsequent to the first physical polygon being attached to the first physical mesh.

12. The computer-implemented method of claim 1, wherein the scanned 3D model of the first physical mesh is generated by a computer vision engine and transmitted to a design engine.

13. One or more non-transitory computer-readable media storing instructions that, when executed by one or more processors, cause the one or more processors to perform the steps of:
   selecting a first simulated polygon that is included in a first simulated mesh;
   causing a first robot to obtain a first physical polygon that corresponds to the first simulated polygon;

causing the first robot to position the first physical polygon on a first physical mesh;
causing a second robot to attach the first physical polygon to the first physical mesh;
updating the first simulated mesh based on a scanned 3D model of the first physical mesh generated from optical data associated with positioning and attaching the physical polygon to the first physical mesh to generate an updated simulated mesh that geometrically correspond to at least a portion of the first physical mesh;
selecting a second simulated polygon that is included in the updated simulated mesh;
causing the first robot to obtain a second physical polygon that corresponds to the second simulated polygon;
causing the first robot to position the second physical polygon on the first physical mesh; and
causing the second robot to attach the second physical polygon to the first physical mesh.

14. The one or more non-transitory computer-readable media of claim 13, further comprising:
obtaining optical data related to the first physical polygon; and
determining, based on the optical data, that a first portion of the first physical mesh is geometrically different than a first portion of the first simulated mesh.

15. The one or more non-transitory computer-readable media of claim 14, wherein determining that the first physical mesh is geometrically different than the first portion of the first simulated mesh comprises determining that a position associated with a vertex of the first simulated polygon is different than a position associated with a corresponding vertex of the first physical polygon.

16. The one or more non-transitory computer-readable media of claim 13, further comprising updating a position associated with a vertex of the first simulated polygon within the first simulated mesh based on a position associated with a corresponding vertex of the first physical polygon within the first physical mesh.

17. The one or more non-transitory computer-readable media of claim 16, further comprising updating a position associated with a third simulated polygon within the first simulated mesh to cause the first simulated mesh to be watertight.

18. The one or more non-transitory computer-readable media of claim 13, further comprising:
generating a plurality of simulated meshes based on a position of a vertex of the first physical polygon;
evaluating a cost function with respect to each simulated mesh included in the plurality of simulated meshes to generate a cost value for each simulated mesh;
identifying a second simulated mesh included in the plurality of simulated meshes having a lower cost value than every other simulated mesh included in the plurality of simulated meshes; and
replacing the first simulated mesh with the second simulated mesh.

19. The one or more non-transitory computer-readable media of claim 18, further comprising:
selecting a third simulated polygon that is included in the second simulated mesh;
causing the first robot to obtain a third physical polygon that corresponds to the third simulated polygon;
causing the first robot to position the third physical polygon on the first physical mesh; and
causing the second robot to attach the third physical polygon to the first physical mesh.

20. The one or more non-transitory computer-readable media of claim 18, wherein the cost function includes a first term that penalizes any change in curvature identified in any of the simulated meshes included in the plurality of simulated meshes.

21. The one or more non-transitory computer-readable media of claim 18, wherein the cost function includes a first term that penalizes a number of simulated polygons included in any of the simulated meshes included in the plurality of simulated meshes that are different than a number of simulated polygons included in the first simulated mesh.

22. The one or more non-transitory computer-readable media of claim 13, wherein causing the first robot to obtain the first physical polygon comprises causing the first robot to fabricate the first physical polygon based on the first simulated polygon.

23. The one or more non-transitory computer-readable media of claim 13, further comprising updating the first simulated mesh to geometrically correspond to at least a portion of the first physical mesh subsequent to the first physical polygon being attached to the first physical mesh.

24. A system, comprising:
one or more memories storing instructions; and
one or more processors that are coupled to the one or more memories and,
when executing the instructions, are configured to perform the steps of:
selecting a first simulated polygon that is included in a first simulated mesh,
causing a first robot to obtain a first physical polygon that corresponds to the first simulated polygon,
causing the first robot to position the first physical polygon on a first physical mesh,
causing a second robot to attach the first physical polygon to the first physical mesh,
updating the first simulated mesh based on a scanned 3D model of the first physical mesh generated from optical data associated with positioning and attaching the physical polygon to the first physical mesh to generate an updated simulated mesh that geometrically correspond to at least a portion of the first physical mesh,
selecting a second simulated polygon that is included in the updated simulated mesh,
causing the first robot to obtain a second physical polygon that corresponds to the second simulated polygon,
causing the first robot to position the second physical polygon on the first physical mesh, and
causing the second robot to attach the second physical polygon to the first physical mesh.

* * * * *